United States Patent [19]

Shieh

[11] Patent Number: 4,644,381

[45] Date of Patent: Feb. 17, 1987

[54] I²L HETEROSTRUCTURE BIPOLAR TRANSISTORS AND METHOD OF MAKING THE SAME

[75] Inventor: Chan-Long Shieh, Plainsboro, N.J.

[73] Assignee: Siemens Corporate Research & Support, Inc., Iselin, N.J.

[21] Appl. No.: 721,257

[22] Filed: Apr. 8, 1985

[51] Int. Cl.⁴ ............... H03K 19/091; H01L 27/04; H01L 29/72; H01L 29/225
[52] U.S. Cl. ........................ 357/35; 357/16; 357/15; 357/44; 357/92; 357/55; 148/DIG. 67; 148/DIG. 72; 148/DIG. 87; 148/DIG. 139; 148/DIG. 50; 148/DIG. 11
[58] Field of Search ............ 357/16, 92, 35, 44, 357/46, 36, 15, 55

[56] References Cited

U.S. PATENT DOCUMENTS

| 4,160,988 | 7/1979 | Russell | 357/92 |
| 4,251,298 | 2/1981 | Thompson | 357/16 |
| 4,573,064 | 2/1986 | McLevige et al. | 357/16 |

FOREIGN PATENT DOCUMENTS 2509530 9/1976 Fed. Rep. of Germany.
1528029 12/1975 United Kingdom.

Primary Examiner—William D. Larkins
Attorney, Agent, or Firm—John Francis Moran

[57] ABSTRACT

An integrated injection logic (I²L) semiconductor structure is disclosed which may be advantageously implemented in a group III-V compound semiconductor such as gallium arsenide. The base region of the lateral transistor is made extremely thin (less than one-tenth micron) by use of "regrowth" techniques. The structure of the vertical transistor is simplified by using a Schottky collector.

4 Claims, 7 Drawing Figures

I²L HETEROSTRUCTURE BIPOLAR TRANSISTORS AND METHOD OF MAKING THE SAME

BACKGROUND OF THE INVENTION

The present invention relates to a semiconductor structure for integrated injection logic (I²L). More particularly, the invention relates to I²L transistor structure and a method of making such transistor structure.

Integrated injection logic (I²L) has been known in the art for over ten years. Solid state circuits formed of bipolar transistors using I²L technology have the advantage of high speed, low power and high device packing density. This high packing density is achieved with the elimination of isolation by using transistors with a common emitter at the bottom of the devices. I²L on silicon is now widely used for VLSI applications.

The switching speed of silicon devices is limited by the long minority carrier lifetime in silicon and the low emitter efficiency resulting from the doping profile. The carrier lifetime in group III-V compound semiconductors is usually shorter, however, and the emitter efficiency can be improved, irrespective of the doping profile, by use of heterojunction emitters; i.e., by emitters formed by PN junctions between different materials. Therefore, III-V compound semiconductors are ideal materials for implementing I²L. III-V compound semiconductors have the further advantage of providing high mobility for charge carriers and permitting the formation of graded bandgaps to reduce the transit time. Therefore, I²L on III-V compound semiconductors is a promising technology for high speed VLSI.

The fabrication of I²L circuits on III-V compound semiconductors is hindered, however, by the difficulty in preparing a lateral transistor. The minority carrier diffusion length in a III-V compound semiconductor is very short (less than one micron). Since the base width in the lateral transistor must be smaller than this diffusion length, the definition of the base of a lateral transistor by lithography (diffusion) is nearly impractical.

The use of III-V compound semiconductors in the fabrication of I²L also results in difficulty in making ohmic contact to the various layers which are buried in the structure. Since the different layers in the I²L structure must be very thin to achieve high speed, it becomes difficult to achieve controlled ohmic contact to selected ones of these layers.

The German Patent Document "Offenlegungsschrift" No. 2,509,530 discloses various types of I²L transistor structure. FIGS. 10A and 10B of this patent publication disclose a vertical, or so-called "inverted" transistor formed with a Schottky collector. The use of the Schottky (metal-to-semiconductor) junction is said to eliminate an extra collector doping step.

The British Pat. No. 1,528,029 discloses an I²L semiconductor device formed of a lateral PNP transistor and a vertical NPN transistor. The injector region and the base region of the lateral PNP transistor are formed by double diffusion to enable the base region to have a substantially uniform, but narrow width. As mentioned above, however, the base foration in the lateral device by diffusion in a III-V compound semiconductor is impractical because the base width must be substantially less than one micron.

SUMMARY OF THE INVENTION

An object of the present invention is to provide a method of making transistors for integrated injection logic in a III-V compound semiconductor that permits the fabrication of a thin and uniform base for the lateral transistor.

A further object of the present invention is to provide a method for making transistors in I²L configuration which facilitates the fabrication of controllable ohmic contacts to different layers of the structure.

These objects, as well as other objects which will become apparent in the discussion that follows are achieved, according to the present invention, by the use of regrowth techniques for forming the lateral transistor structure and the use of a Schottky collector to simplify the vertical transistor structure.

The lateral transistor is fabricated by regrowth with the following steps:

(a) growing, on one side of a substrate of a first conductivity type, an epitaxial first layer of the same first conductivity type;

(b) growing an epitaxial second layer on the first layer, with the second layer having a second conductivity type opposite to that of the first conductivity type;

(c) depositing on this second layer an insulating third layer;

(d) etching a first opening in the third and second layers to the depth of the first layer;

(e) growing an epitaxial fourth layer of the first conductivity type in the first opening;

(f) growing an epitaxial fifth layer of the second conductivity type on the fourth layer in the first opening;

(g) etching a second opening in the third, fourth and fifth layers to the depth of the second layer;

(h) depositing an ohmic first contact on the fifth layer over the first opening, thereby contacting the emitter of the lateral transistor, and depositing an ohmic second contact on the second layer through the second opening, thereby contacting the collector of the lateral transistor; and (i) depositing an ohmic third contact on the opposite side of the substrate, thereby contacting the base of the lateral transistor.

The vertical transistor is fabricated adjacent to the lateral transistor by:

(j) etching a third opening in the third, fourth and fifth layers to the depth of the second layer; and (k) depositing a Schottky fourth contact in the third opening on the second layer, thereby forming the collector of the vertical transistor. The emitter of the vertical transistor is contacted by the aforementioned second contact.

Although the use of regrowth techniques and Schottky collectors are known in the art, the present invention makes advantageous use of this technology to define a new I²L semiconductor structure. Advantageously, the regrowth techniques permit the base of the lateral transistor to be fabricated with a very narrow width; e.g., less than one-tenth micron.

For a full understanding of the present invention, reference should now be made to the following detailed description of the preferred embodiments of the invention and to the accompanying drawings.

DESCRIPTION OF THE PREFERRED EMBODIMENTS

Figure 1:
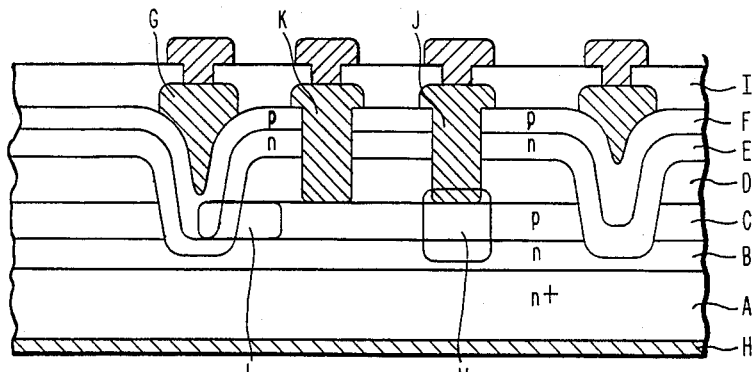
FIG. 1 is a cross-sectional view of an I²L semiconductor structure according to a preferred embodiment of the present invention.

The preferred embodiments of the present invention will now be described with reference to FIGS. 1 and 2 of the drawings. Identical elements in the various figures are designated with the same reference numerals (letters).

FIG. 1 illustrates the full structure of the heterostructure I²L circuit according to the invention. Two bipolar transistors comprise the I²L circuit: a lateral pnp transistor indicated by the heavy line surrounding the area L and a vertical npn transistor indicated by the heavy line surrounding the area V (or interchangeably, a lateral npn and vertical pnp transistor, respectively). Either one of these combinations can be used with this circuit. The vertical transistor V is composed of layers B, C and J where B is the emitter, C is the base and J is the Schottky collector. The lateral transistor L is composed of layers F, E, C where F is the emitter, E is the base and C is the collector.

The polarities of layers B and E should be the same as that of the substrate A and the polarities of layers C and F should be opposite to that of the substrate A. The bandgap of all these layers can be uniform or graded. For speed enhancement, the bandgap of layer B and C should decrease as it goes upwards. In order to take advantage of the concept of heterojunction emitter and carrier confinement, the bandgap of layer B should be larger than that of layer C and E. The bandgap of layer F should be larger than that of E. The bandgap of layer E should be larger than that of C, as illustrated in the forthcoming examples.

To fabricate the devices a III-V compound semiconductor such as gallium arsenide (GaAs) is preferably used as substrate A. Two consecutive epitaxial layers B and C are grown, B and C having the appropriate polarity according to the substrate. A layer D of insulating material is deposited and patterned. The insulator layer D is used as a mask for etching the semiconductor layer C. Two epitaxial semiconductor layers E and F are then deposited over the layers B, C and D. This technology is known as "regrowth". The material deposited over the insulator layer D will become semi-insulating because it is polycrystalline.

The epitaxial layers B and C and the regrowth of layers E and F can be done by common epitaxy technologies such as molecular beam epitaxy (MBE), liquid phase epitaxy (LPE), vapor phase epitaxy (VPE) and/or metal organic chemical vapor deposition (MOCVD).

To fabricate the I²L circuit contacts have to be established to the following layers: ohmic contacts G and K to layers F and C and a Schottky contact J to layer C as is illustrated in FIG. 2.

Since the portions of layers F and E above the insulator layer D are semi-insulating, they provide the isolation of the devices.

The contacts to the transistor are established as follows:

An opening for the ohmic contact to layer C is etched through the insulating layers F and E. After patterning, ohmic contacts G and K are applied simultaneously to both F and C, respectively. Ohmic contact H is then formed on the back of the substrate to connect the common emitter. An insulator layer I is deposited on top and patterned for the contact opening for the Schottky contact to layer C as well as for contact holes to contacts G and K. The Schottky metal J is then deposited and patterned to form the necessary interconnections.

Figure 2A:
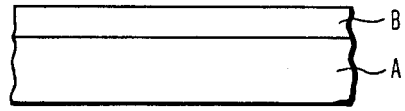
FIGS. 2A, 2B, 2C, 2D, 2E and 2F are cross-sectional views which illustrate the steps of manufacturing the lateral transistor of an I²L circuit according to the invention.
Figure 2B:
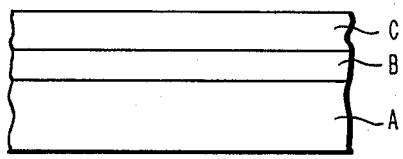
Figure 2C:
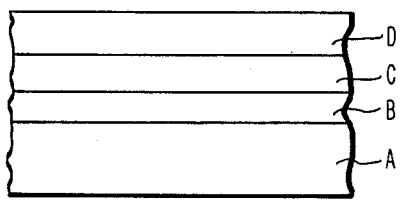

The steps for fabricating the lateral transistor are illustrated in FIGS. 2A–2F. FIG. 2A shows a substrate A, which may be a gallium arsenide substrate with n+ conductivity, supporting an epitaxial layer B of n conductivity. Thereafter, as shown in FIG. 2B, a first epitaxial layer C of the opposite conductivity type (p) is grown on the substrate A and layer B. In FIG. 2C, an insulating layer D, e.g., of silicon nitride, is deposited on the layer C.

Figure 2D:
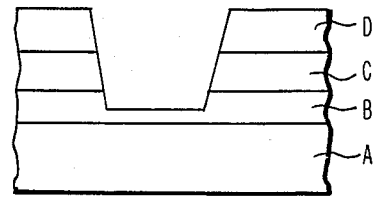
Figure 2E:
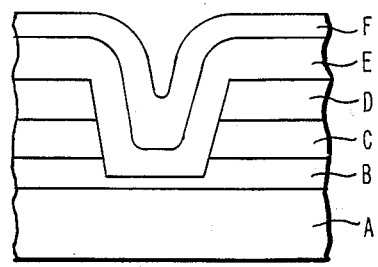

The insulator layer D is used as a mask to etch into the semiconductor structure. FIG. 2D shows how an opening has been etched into the layers C and B through a window formed by the layer D. Thereafter, layers E and F of the first and second conductivity types, respectively, are epitaxially grown in the region of the opening and on top of the insulator layer D. The material grown on top of the insulator layer will be polycrystalline, and therefore semi-insulating.

Figure 2F:
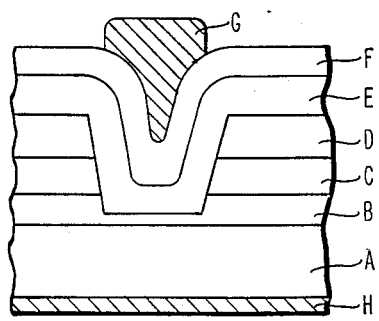

Finally, as shown in FIG. 2F, ohmic contact metal G is deposited in the trench formed by the layers E and F to contact the emitter of the lateral transistor. Ohmic contact metal H is also deposited on the opposite side of the substrate A to contact the base of this transistor.

The Schottky contact for the vertical transistor may be made by opening a hole in the layers F, E and D, down to the layer C. The etchant used in forming the hole, which may be Freon 14 ($CF_4$) for example, will stop at the layer C because it preferentially attacks the silicon nitride layer D but not the gallium arsenide layer C.

EXAMPLES (1) Vertical npn and lateral pnp transistors with uniform base bandgap. The composition of all different layers is listed as follows:

A = n+-GaAs substrate
B = n-$Al_{0.3}Ga_{0.7}As$
C = p-GaAs
D = $Si_3N_4$
E = n-$Al_{0.1}Ga_{0.9}As$
F = p+-$Al_{0.3}Ga_{0.7}As$
G = Au: Be/Ti/Pt/Au
H = Au: Ge/Ni/Ti/Pt/Au
I = $Si_3N_4$
J = Ti/Pt/Au (2) Vertical pnp and lateral pnp transistors with uniform base composition.

A = p+-GaAs substrate
B = p-$Al_{0.3}Ga_{0.7}As$
C = n-GaAs
D = $Si_3N_4$
E = p-$Al_{0.1}Ga_{0.9}As$
F = n+-$Al_{0.3}Ga_{0.7}As$
G = Au: Ge/Ni/Ti/Pt/Au H=Au: Be/Ti/Pt/Au
I=Ti/Pt/Au (3) Vertical npn and lateral pnp transistors with graded base bandgap.

A=n+GaAs substrate
B=n-$Al_{0.3}Ga_{0.7}As$
C=graded from p-$Al_{0.1}Ga_{0.9}As$ (bottom) to p-GaAs (top)
D=$Si_3N_4$
E=graded from n-$Al_{0.1}Ga_{0.9}As$ (bottom) to n-$Al_{0.2}Ga_{0.8}As$ (top)
F=p+-$Al_{0.3}Ga_{0.7}As$
G=Au: Be/Ti/Pt/Au
H=Au: Ge/Ni/Ti/Pt/Au
I=$Si_3N_4$
J=Ti/Pt/Au (4) Vertical pnp and lateral npn transistors with graded base bandgap.

A=p+-GaAs substrate
B=p-$Al_{0.3}Ga_{0.7}As$
C=graded from n-$Al_{0.1}Ga_{0.9}As$ (bottom) to n-GaAs (top)
D=$Si_3N_4$
E=graded from p-$Al_{0.1}Ga_{0.9}As$ (bottom) to p-$Al_{0.2}Ga_{0.8}As$ (top)
F=n+-$Al_{0.3}Ga_{0.2}As$
G=Au: Ge/Ni/Ti/Pt/Au
H=Au: Be/Ti/Pt/Au
I=$Si_3N_4$
J=Ti/Pt/Au There has thus been shown and described a novel I²L circuit which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An integrated injection logic semiconductor structure comprising:
    a substrate having a first conductivity type and comprising a group III–V compound of semiconductor material;
    an epitaxial first layer of said first conductivity type disposed on one side of said substrate;
    an epitaxial second layer of a second opposite conductivity type disposed on said first layer;
    an insulating third layer disposed on said second layer;
    an epitaxial fourth layer of said first conductivity type disposed in a first opening in said second and third layers to the depth of said first layer;
    an epitaxial fifth layer of said second conductivity type disposed on said fourth layer in said first opening;
    an ohmic first contact disposed on said fifth layer over said first opening, forming the emitter contact of a lateral transistor;
    an ohmic second contact disposed on said second layer through a second opening in said third, fourth and fifth layers, forming the collector contact of said lateral transistor;
    an ohmic third contact disposed on the opposite side of said substrate, forming the base contact of said lateral transistor; and
    said third layer having a graded bandgap.

2. The semiconductor structure defined in claim 1, further comprising a Schottky fourth contact disposed on said second layer through an opening in said third, fourth and fifth layers, thereby forming the collector of a vertical transistor.

3. The semiconductor structure defined in claim 1, wherein said third layer is less than one-tenth micron thick.

4. The semiconductor structure defined in claim 1, wherein said first conductivity type is negative (n) and said second conductivity type is positive (p).

* * * * *